US009608223B2

United States Patent
Jung et al.

(10) Patent No.: US 9,608,223 B2
(45) Date of Patent: Mar. 28, 2017

(54) ORGANIC LIGHT EMITTING DIODE AND ORGANIC LIGHT EMITTING DIODE DISPLAY DEVICE INCLUDING THE SAME

(71) Applicant: LG Display Co., Ltd., Seoul (KR)

(72) Inventors: Young-Kwan Jung, Daegu (KR); Hyo-Seok Kim, Goyang-si (KR); Tae-Il Kum, Paju-si (KR); Hyung-June Kim, Paju-si (KR); Seong-Su Jeon, Gwangmyeong-si (KR)

(73) Assignee: LG DISPLAY CO., LTD., Seoul (KR)

( * ) Notice: Subject to any disclaimer, the term of this patent is extended or adjusted under 35 U.S.C. 154(b) by 64 days.

(21) Appl. No.: 14/552,965

(22) Filed: Nov. 25, 2014

(65) Prior Publication Data

US 2015/0187850 A1 Jul. 2, 2015

(30) Foreign Application Priority Data

Dec. 30, 2013 (KR) ........................ 10-2013-0167617

(51) Int. Cl.
*H01L 51/50* (2006.01)
*H01L 51/00* (2006.01)

(52) U.S. Cl.
CPC ...... *H01L 51/5016* (2013.01); *H01L 51/5004* (2013.01); *H01L 51/0052* (2013.01); *H01L 51/0061* (2013.01); *H01L 51/0067* (2013.01); *H01L 51/0072* (2013.01); *H01L 51/0085* (2013.01); *H01L 51/504* (2013.01); *H01L 51/506* (2013.01); *H01L 51/5056* (2013.01); *H01L 2251/308* (2013.01)

(58) Field of Classification Search
None
See application file for complete search history.

(56) References Cited

U.S. PATENT DOCUMENTS

| 7,994,498 B2* | 8/2011 | Pieh | H01L 27/3209 257/40 |
| 8,350,257 B2* | 1/2013 | Pieh | H01L 51/5036 257/40 |
| 8,735,873 B2* | 5/2014 | Song | H01L 51/5004 257/40 |

(Continued)

FOREIGN PATENT DOCUMENTS

| JP | 2013-115087 A | 6/2013 | |
| WO | WO 2011/148909 A1 | 12/2011 | |
| WO | WO 2012/153603 | * 11/2012 | H01L 51/50 |

OTHER PUBLICATIONS

Zhang et al., Enhanced efficiency in high-brightness fluorescent organic light emitting diodes through triplet management, Applied Physics Letters, vol. 99, 223303, (2011).

(Continued)

*Primary Examiner* — Victoria K Hall
(74) *Attorney, Agent, or Firm* — Birch, Stewart, Kolasch & Birch, LLP

(57) ABSTRACT

An organic light emitting diode includes an anode; a cathode facing the anode; a first emitting material layer between the anode and the cathode and including a first host material, the first host material having a first triplet energy; and a hole transporting layer between the first emitting material layer and the anode, a material of the hole transporting layer having a second triplet energy being larger than the first triplet energy.

4 Claims, 4 Drawing Sheets

(56) References Cited

U.S. PATENT DOCUMENTS

| | | | |
|---|---|---|---|
| 8,796,676 B2* | 8/2014 | Pieh | H01L 51/5203 257/40 |
| 8,829,504 B2* | 9/2014 | Song | H01L 51/5044 257/40 |
| 8,884,274 B2* | 11/2014 | Han | H01L 51/5004 257/40 |
| 8,963,127 B2* | 2/2015 | Pieh | H01L 51/5036 257/40 |
| 9,088,001 B2* | 7/2015 | Kim | H01L 51/5008 |
| 9,159,957 B2* | 10/2015 | Pieh | H01L 51/504 |
| 2006/0033446 A1* | 2/2006 | Kim | H01L 27/12 315/169.3 |
| 2012/0119197 A1 | 5/2012 | Nishimura et al. | |
| 2012/0126205 A1* | 5/2012 | Kawamura | H01L 51/0055 257/40 |
| 2013/0069077 A1* | 3/2013 | Song | H01L 51/5278 257/76 |
| 2013/0146850 A1* | 6/2013 | Pieh | H01L 51/5203 257/40 |
| 2014/0103321 A1* | 4/2014 | Furukawa | C09K 11/06 257/40 |
| 2015/0155513 A1* | 6/2015 | Pieh | H01L 27/3209 257/40 |

OTHER PUBLICATIONS

Baldo, et al., Translent Analysis of organic electrophosphorescence. II Transient analysis of triplet-triplet annihilation, Physical Review B, vol. 62, No. 16, Oct. 15, 2000, pp. 10967-10977.

* cited by examiner

Exciton energy

ORGANIC LIGHT EMITTING DIODE AND ORGANIC LIGHT EMITTING DIODE DISPLAY DEVICE INCLUDING THE SAME

This application claims priority to and the benefit of Korean Patent Application No. 10-2013-0167617 filed in Korea on Dec. 30, 2013, which is herein incorporated by reference.

BACKGROUND OF THE INVENTION

Field of the Invention

The embodiments of the invention relate to an organic light emitting diode (OLED) display device, and more particularly, to an organic light emitting diode having improved emission efficiency and an OLED display device including the same.

Description of the Related Art

An OLED display device of new flat panel display devices has high brightness and low driving voltage. The OLED display device is a self-emitting type and has excellent characteristics of a view angle, a contrast ratio, a response time, a thin profile and so on.

In addition, there is a big advantage in a production cost. A fabricating process of the OLED display device is very simple and requires a deposition apparatus and an encapsulating apparatus.

The OLED display device includes an organic light emitting diode for emitting light. The OLED display device uses the light from the organic light emitting diode to display images.

FIG. 1 is a schematic cross-sectional view of a related art organic light emitting diode.

As shown in FIG. 1, the organic light emitting diode "D" includes a first electrode 10 as an anode, a second electrode 30 as a cathode and an organic emitting layer 20 therebetween.

The first electrode 10 as the anode is formed of a material having a higher work function than a material of the second electrode 30 as the cathode. For example, the first electrode 10 may be formed of one of indium-tin-oxide (ITO), and the second electrode 30 may be formed of aluminum (Al) or Al alloy (AlNd). The organic emitting layer 20 includes red, green and blue emitting patterns.

To increase emission efficiency, the organic material layer 20 may have a multi-layered structure. For example, the organic material layer 200 may include a hole injecting layer (HIL) 21, a hole transporting layer (HTL) 22, the emitting material layer (EML) 23, the electron transporting layer (ETL) 24 and the electron injecting layer (EIL) 25 sequentially staked on the first electrode 10.

In the organic light emitting diode "D", the holes and the electrons respectively from the first and second electrodes 10 and 20 are combined in the EML 23 such that excitons are generated. When the electric energy of the exciton is changed into the light energy, the light having a color in accordance with an energy band gap of the EML 23 is emitted. According to the material of the EML 23, red, green and blue organic light emitting diodes are provided.

Recently, the phosphorescent material in place of the fluorescent material is increasingly used for a material of the EML. The singlet exciton generates a fluorescent type emission, while the triplet exciton generates a phosphorescent type emission. The singlet exciton has a formation probability of about 25%, while the triplet exciton has a formation probability of about 75%. Accordingly, the phosphorescent type emission has emission efficiency greater than the fluorescent type emission.

Since the emission efficiency of the organic light emitting diode "D" has a direct effect on the power consumption of the OLED display device, an increase in the emission efficiency of the organic light emitting diode "D" is a requirement. For example, new material used for the EML and having high emission efficiency may be developed for such an increase, or new material having high hole injecting or transporting property may be developed for such an increase.

However, there are still limitations to increasing the emission efficiency of the organic light emitting diode.

SUMMARY OF THE INVENTION

Accordingly, the embodiments of the invention are directed to an OLED and an OLED display device that substantially obviate one or more of the problems due to limitations and disadvantages of the related art.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

In accordance with an embodiment of the invention, as embodied and broadly described herein, the invention provides an organic light emitting diode including an anode; a cathode facing the anode; a first emitting material layer between the anode and the cathode and including a first host material, the first host material having a first triplet energy; and a hole transporting layer between the first emitting material layer and the anode, a material of the hole transporting layer having a second triplet energy being larger than the first triplet energy.

In another aspect, an embodiment of the invention provides an organic light emitting diode display device including a gate line and a data line on a first substrate and crossing each other; a power line parallel to one of the gate line and the data line; a switching thin film transistor connected to the gate line and the data line; a driving thin film transistor connected to the switching thin film transistor and the power line; and an organic light emitting diode connected to the driving thin film transistor, the organic light emitting diode including: an anode; a cathode facing the anode; a first emitting material layer between the anode and the cathode and including a first host material, the first host material having a first triplet energy; and a hole transporting layer between the first emitting material layer and the anode, a material of the hole transporting layer having a second triplet energy being larger than the first triplet energy.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE EMBODIMENTS

Reference will now be made in detail to the preferred embodiments, examples of which are illustrated in the accompanying drawings.

Figure 1:
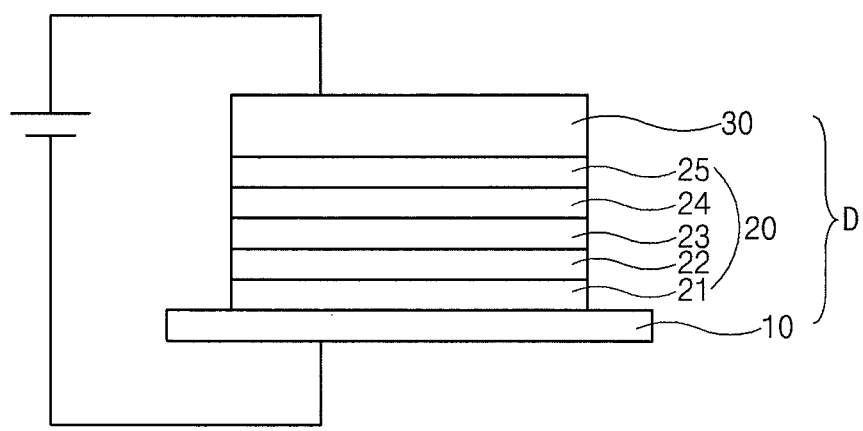
FIG. 1 is a schematic cross-sectional view of a related art organic light emitting diode.
Figure 2:
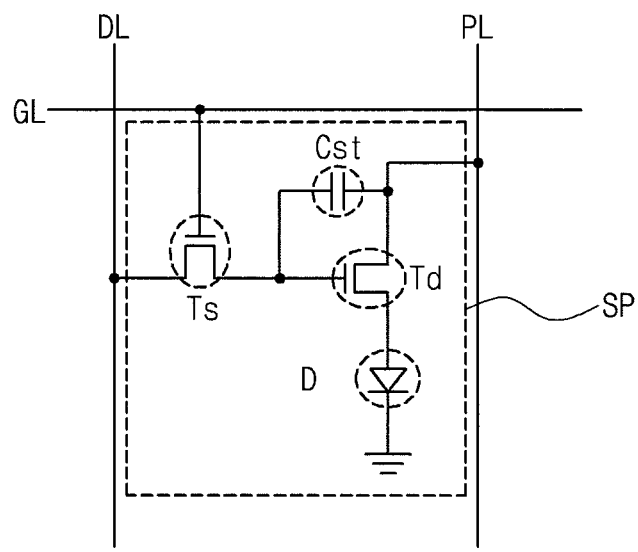
FIG. 2 is a circuit diagram of one sub-pixel region of an OLED display device according to an embodiment of the invention.

FIG. 2 is a circuit diagram of one sub-pixel region of an OLED display device according to an embodiment of the invention.

As shown in FIG. 2, an OLED display device includes a switching thin film transistor (TFT) "Ts", a driving TFT "Td", a storage capacitor "Cst" and an organic light emitting diode "D" in each sub-pixel region "SP". In addition, a gate line "GL" and a data line "DL", which crosses the gate line "GL" to define the sub-pixel region "SP", and a power line "PL" are formed.

The switching TFT "Ts" is connected to the gate and data lines "GL" and "DL", the driving TFT "Td" and the storage capacitor "Cst" are connected to the switching TFT "Ts" and the power line "PL". The organic light emitting diode "D" is connected to the driving TFT "Td".

When the switching TFT "Ts" is turned on by a gate signal applied through the gate line "GL", a data signal from the data line "DL" is applied to the gate electrode of the driving TFT "Td" and an electrode of the storage capacitor "Cst" through the switching TFT When the driving TFT "Td" is turned on by the data signal, an electric current is supplied to the organic light emitting diode "D" from the power line "PL". As a result, the organic light emitting diode "D" emits light. In this case, when the driving TFT "Td" is turned on, a level of an electric current applied from the power line "PL" to the organic light emitting diode "D" is determined such that the organic light emitting diode "D" can produce a gray scale.

The storage capacitor "Cst" serves to maintain the voltage of the gate electrode of the driving TFT "Td" when the switching TFT "Ts" is turned off. Accordingly, even if the switching TFT "Ts" is turned off, a level of an electric current applied from the power line "PL" to the organic light emitting diode "D" is maintained to a next frame.

Accordingly, the OLED display device displays desired images with the gate signal and the data signal.

The organic light emitting diode "D" includes a first electrode as an anode, a hole transporting layer (HTL), an emitting material layer (EML), an electron transporting layer (ETL) and a second electrode as a cathode. To increase emission efficiency, the organic light emitting diode "D" may further include a hole injecting layer (HIL) between the first electrode and the HTL and an electron injecting layer (EIL) between the ETL and the second electrode. In addition, the EML may have a double-layered structure of first and second emitting layers formed of different materials.

A relative magnitude of a triplet energy of the HTL, the EML and the ETL greatly affects the emission efficiency of the organic light emitting diode "D". Namely, the triplet energies of the EML and other layers, which are adjacent to the EML, are an important factor in the emission efficiency of the organic light emitting diode "D".

Figure 3A:
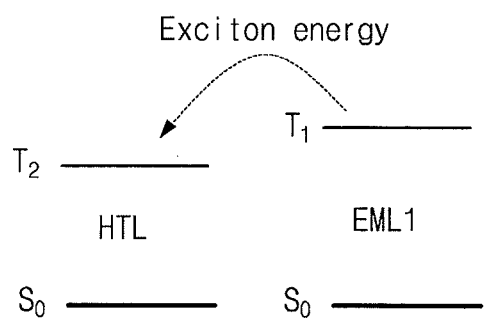
FIGS. 3A and 3B are views illustrating limitation of emission efficiency according to an energy level in an organic light emitting diode.
Figure 3B:
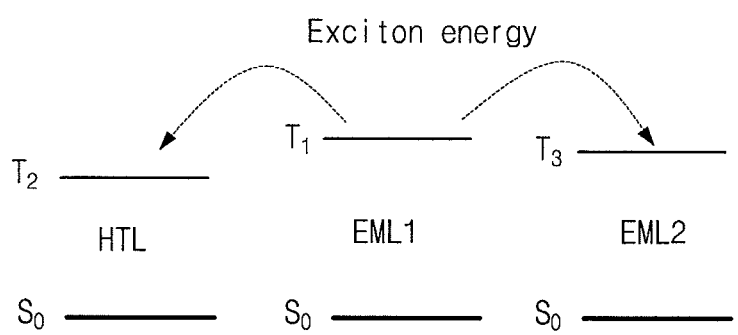

FIGS. 3A and 3B are views illustrating limitation of emission efficiency according to an energy level in an organic light emitting diode.

As shown in FIG. 3A, in the organic light emitting diode including the emitting material layer "EML1" and the hole transporting layer "HTL", when a triplet energy "T1" of a host material in the emitting material layer "EML1" is higher than a triplet energy "T2" of a material in the hole transporting layer "HTL", an energy of the exciton, which is generated by combination of the holes and the electrons respectively from the anode and the cathode, goes from the emitting material layer "EML1" into the hole transporting layer "HTL". As a result, the emission efficiency is reduced.

Even when the triplet energy of the material in the electron transporting layer is lower than the triplet energy "T1" of the host material in the emitting material layer "EML1", the energy transition is also generated.

The exciton should remain in the emitting material layer "EML1" to emit the light. However, as explained above, when the exciton insufficiently remains in the emitting material layer "EML1" and the energy transition to the hole transporting layer "HTL" (or ETL) is generated, the emission efficiency of the organic light emitting diode is reduced.

In addition, as shown in FIG. 3B, in the organic light emitting diode including a first emitting material layer "EML1", a second emitting material layer "EML2" and the hole transporting layer "HTL", when the triplet energy "T1" of the host material in the first emitting material layer "EML1", which is adjacent to the hole transporting layer "HTL", is higher than the triplet energy "T2" of the material in the hole transporting layer "HTL", an energy of the exciton, which is generated by combination of the holes and the electrons respectively from the anode and the cathode, goes from the emitting material layer "EML1" into the hole transporting layer "HTL".

In addition, when the triplet energy "T1" of the host material in the first emitting material layer "EML1" is higher than the triplet energy "T3" of the host material in the second emitting material layer "EML2", an energy of the exciton goes from the emitting material layer "EML1" into the second emitting material layer "EML2".

In the emitting material layer having the double-layered structure, although the exciton is generated in the first emitting material layer "EML1", which is adjacent to the hole transporting layer "HTL", the exciton does not remain in the first emitting material layer "EML1", and the energy transition to the second emitting material layer "EML2" and the hole transporting layer "HTL" (or ETL) occurs. As a result, the emission efficiency of the organic light emitting diode is further reduced, and desired luminescent property is not obtained.

Accordingly, in the embodiments of the invention, by controlling the triplet energy in the emitting material layer as an emission region and the adjacent layers, the exciton remains in the emission region to improve the emission efficiency of the organic light emitting diode and the OLED display device.

Figure 4:
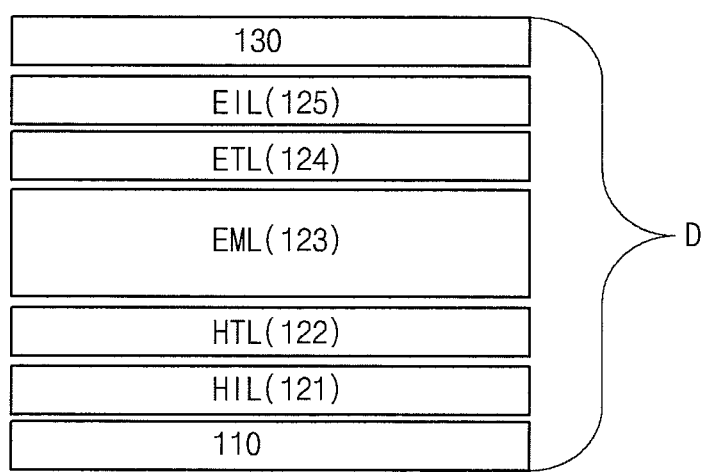
FIG. 4 is a schematic cross-sectional view of an organic light emitting diode according to a first embodiment of the invention.

FIG. 4 is a schematic cross-sectional view of an organic light emitting diode according to a first embodiment of the invention.

As shown in FIG. 4, an organic light emitting diode "D" includes a first electrode 110 as an anode, a second electrode 130 as a cathode, an emitting material layer (EML) 123 and a hole transporting layer (HTL) 122. The first and second electrodes 110 and 130 are spaced part from each other. The EML 123 is positioned between the first and second electrodes 110 and 130, and the HTL 122 is positioned between the first electrode 110 and the EML 123.

A host material in the EML 123 has a first triplet energy, and a material of the HTL 122 has a second triplet energy being higher or larger than the first triplet energy. For example, the second triplet energy is higher than the first triplet energy by about 0.1 eV. ((second triplet energy)−(first triplet energy)≥0.1 eV)

Accordingly, the exciton energy, which is generated by combining the holes and the electrons respectively from the first electrode 110 as the anode and the second electrode 130 as the cathode, does not go into the HTL 122 such that the exciton sufficiently remains in the EML 123. As a result, the emission efficiency of the organic light emitting diode "D" is improved.

Figure 5:
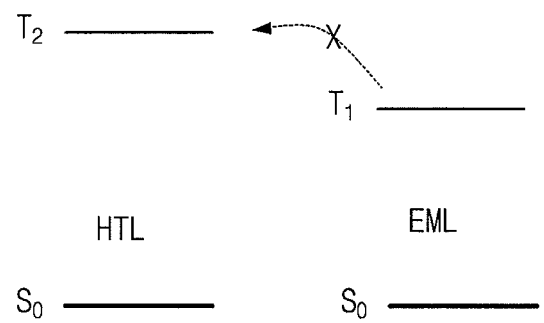
FIG. 5 is a view illustrating an energy level in an organic light emitting diode according to the first embodiment of the invention.

Namely, referring to FIG. 5, which is a view illustrating an energy level in an organic light emitting diode according to the first embodiment of the invention, the emitting material layer "EML" has a first triplet energy "T1", and the hole transporting layer "HTL" has a second triplet energy "T2" being higher than the first triplet energy "T1". The triplet energy difference between the emitting material layer "EML" and the hole transporting layer "HTL" serves as an energy barrier such that the transition of the exciton energy from the emitting material layer "EML" into the hole transporting layer "HTL" is prevented or reduced.

For example, the host material of the EML 123 may be represented by following Formula 1 and has a triplet energy of about 2.66 eV. (T1=2.66 eV)

[Formula 1]

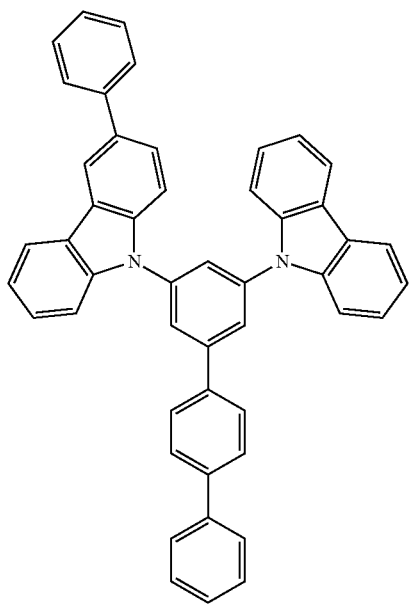

In addition, the material of the HTL 122 may be represented by following Formula 2 or Formula 3.

[Formula 2]

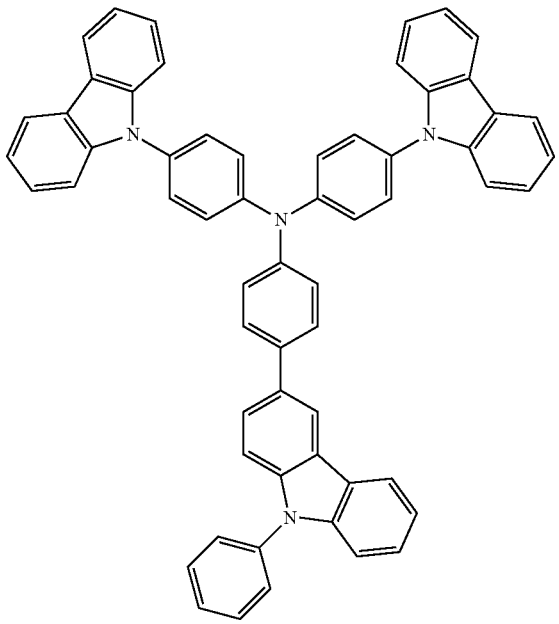

[Formula 3]

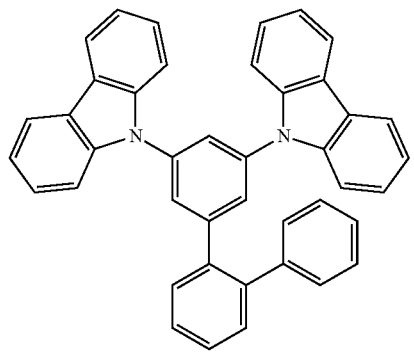

The materials in the above Formula 2 and Formula 3 have a relatively high triplet energy and excellent hole transporting properties. The triplet energy of the material of the Formula 2 is about 2.80 eV, and the triplet energy of the material of the Formula 3 is about 2.82 eV. Accordingly, without decreasing the hole transporting property, the transition of the exciton energy from the EML 123 into the HTL 122 is prevented or reduced such that the emission efficiency is remarkably improved.

Referring again to FIG. 4, the organic light emitting diode "D" may further include an electron transporting layer (ETL) 124 between the EML 123 and the second electrode 130, a hole injecting layer (HIL) 121 between the HTL 122 and the first electrode 110, and an electron injecting layer (EIL) 125 between the ETL 124 and the second electrode 130.

A triplet energy of the material of the ETL 124 is also higher than the triplet energy "T1" (of FIG. 5) of the host material in the EML 123 to prevent or reduce the transition of the exciton energy from the EML 123 into the ETL 124. However, since emission is generated at a region in the EML 123 at a side of the HTL 122, the exciton energy going into the ETL 124 is smaller than the exciton energy going into the HTL 122. On the other hand, there is a tendency in that the electron transporting property of the ETL 124 is inversely-proportional to the triplet energy of the material in the ETL 124. Accordingly, there is not a strong relationship between the triplet energy of the material in the ETL 124 and the triplet energy of the host material in the EML 123.

Figure 6:
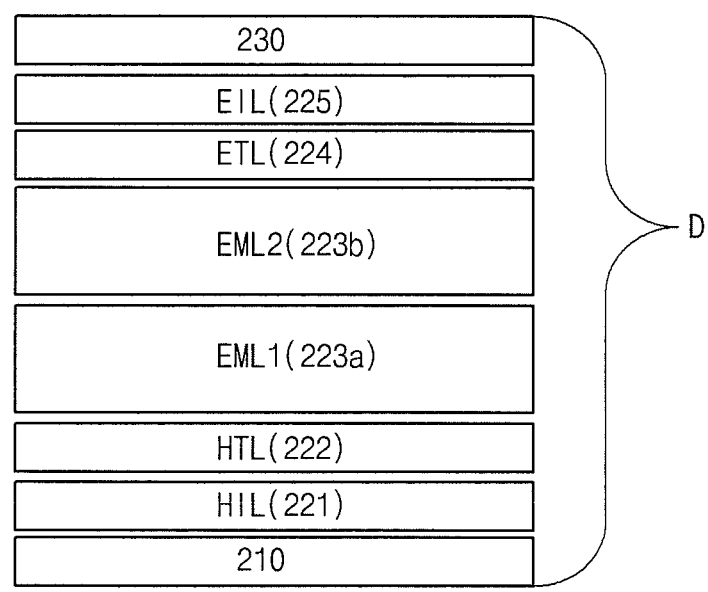
FIG. 6 is a schematic cross-sectional view of an organic light emitting diode according to a second embodiment of the invention.

FIG. 6 is a schematic cross-sectional view of an organic light emitting diode according to a second embodiment of the invention.

As shown in FIG. 6, the organic light emitting diode "D" includes a first electrode 210 as an anode, a second electrode 230 as a cathode, a first emitting material layer (EML1) 223a, a second emitting material layer (EML2) 223b and a hole transporting layer (HTL) 222. The first and second electrodes 210 and 230 are spaced part from each other. The first EML1 223a is positioned between the first and second electrodes 210 and 230, and the HTL 222 is positioned between the first electrode 210 and the EML1 223a. The EML2 223b is positioned between the EML1 223a and the second electrode 230.

A first host material in the EML1 223a has a first triplet energy, and a material in the HTL 222 has a second triplet energy being higher (or larger) than the first triplet energy. In addition, a second host material in the EML2 223b has a third triplet energy being higher than the first triplet energy. For example, each of the second triplet energy and the third triplet energy may be larger than the first triplet energy by about 0.1 eV.

The holes from the first electrode 210 and the electrons from the second electrode 230 are combined with each other in the EML1 223a to generate the excitons. Namely, the EML1 223a is a main emission region, and the EML2 223b serves as an auxiliary (or minor) emitting material layer.

Since each of the second triplet energy of the material in the HTL 222 and the third triplet energy of the second host material in the EML2 223b is higher than the first triplet energy of the first host material in the EML1 223a, the energy of the excitons generated in the EML1 223a does not go into the HTL 222 and the EML2 223b and the excitons sufficiently remain and emit the light in the EML1 223a. Accordingly, the emission efficiency of the organic light emitting diode "D" is improved.

Figure 7:
FIG. 7 is a view illustrating an energy level in an organic light emitting diode according to the second embodiment of the invention.

Namely, referring to FIG. 7, which is a view illustrating an energy level in an organic light emitting diode according to the second embodiment of the invention, the first emitting material layer "EML1" has the first triplet energy "T1", and the hole transporting layer "HTL" has the second triplet energy "T2" being larger than the first triplet energy "T1". The second emitting material layer "EML2" has the third triplet energy "T3" being larger than the first triplet energy "T1".

The triplet energy difference between the first emitting material layer "EML1" and each of the hole transporting layer "HTL" and the second emitting material layer "EML2" serves as an energy barrier such that the transition of the exciton energy from the first emitting material layer "EML1" into the hole transporting layer "HTL" and the second emitting material layer "EML2" is prevented or reduced.

For example, the host material in the EML1 223a may be the material in the above Formula 1, and the material in the HTL 222 may be the material in the above Formula 2 or Formula 3. In addition, the host material in the EML2 223b may be the material in the above Formula 2 or Formula 3.

Referring again to FIG. 6, the organic light emitting diode "D" may further include an electron transporting layer (ETL) 224 between the EML2 223b and the second electrode 230, a hole injecting layer (HIL) 221 between the HTL 222 and the first electrode 210, and an electron injecting layer (EIL) 225 between the ETL 224 and the second electrode 230.

Figure 8:
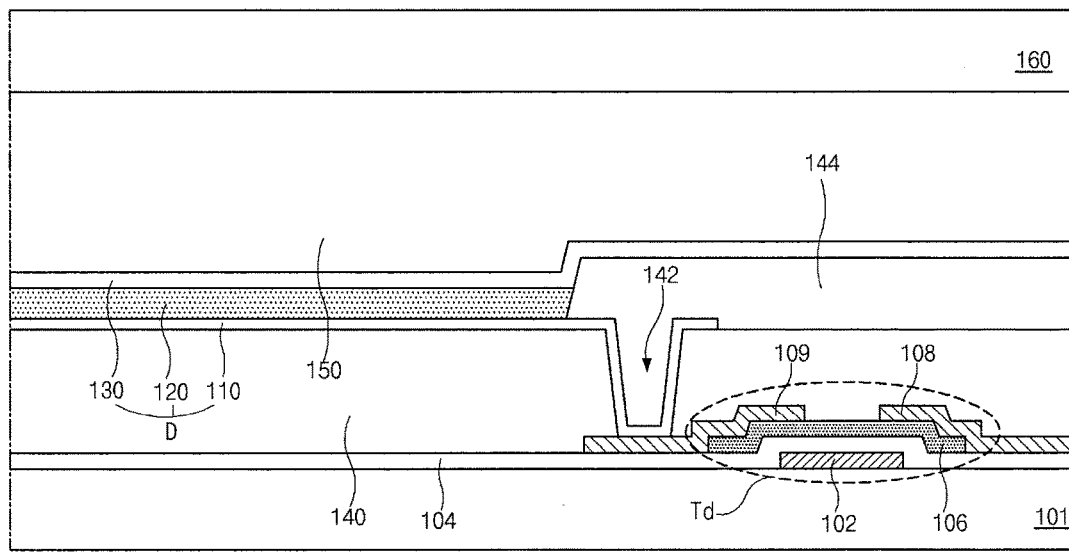
FIG. 8 is a schematic cross-sectional view of an OLED display device according to an embodiment of the invention.

FIG. 8 is a schematic cross-sectional view of an OLED display device according to an embodiment of the invention.

As shown in FIG. 8, an OLED display device 100 includes a first substrate 101, a second substrate 160 and an organic light emitting diode "D" therebetween. The OLED display device 100 may further include a sealing layer 150 between the first and second substrates 101 and 160. The sealing layer 150 may cover an entire surface of the first and second substrates 101 and 160. The first and second substrates 101 and 160 faces and are spaced apart from each other.

A plurality of pixel regions "P" are defined in the first and second substrates 101 and 160. A switching TFT and a driving TFT "Td" are formed in each sub-pixel region "SP" (see FIG. 2) on the first substrate 101. The first substrate 101 may be referred to as a lower substrate, a TFT substrate or a backplane, and the second substrate 160 may be referred to as an encapsulation substrate.

A gate line is formed on the first substrate 101 along a first direction, and a gate electrode 102 of the driving TFT "Td" is formed on the first substrate 101. A portion of the gate line extends to form a gate electrode of the switching TFT. A gate insulating layer 104 is formed on the gate line, the gate electrode 102 of the driving TFT "Td" and the gate electrode of the switching TFT.

A semiconductor layer 106 corresponding to the gate electrode 102 of the driving TFT "Td" is formed on the gate insulating layer 104. The semiconductor layer 106 may be an oxide semiconductor layer. In this instance, an etch-stopper for protecting the oxide semiconductor layer 106 may be formed. In addition, another semiconductor layer corresponding to the gate electrode of the switching TFT is formed on the gate insulating layer 104.

A source electrode 108 and a drain electrode 109 are respectively formed at both ends of the semiconductor layer 106, and a data line, which crosses the gate line to define the sub-pixel region "SP", is formed on the gate insulating layer 104. In addition, a power line being parallel to the data line is formed on the gate insulating layer 104. The source electrode 108 of the driving TFT "Td" is connected to the power line.

A source electrode and a drain electrode are respectively formed at both ends of the semiconductor layer of the switching TFT. The source electrode of the switching TFT is connected to the data line, and the drain electrode of the switching TFT is connected to the gate electrode of the driving TFT "Td".

The gate electrode 102, the semiconductor layer 106, the source electrode 108 and the drain electrode 109 constitute the driving TFT "Td".

A passivation layer 140 is formed on the switching TFT and the driving TFT "Td". The passivation layer 140 includes a drain contact hole 142 exposing the drain electrode 109.

The first electrode 110 is formed on the passivation layer 140. The first electrode 110 is electrically connected to the drain electrode 109 through the drain contact hole 142.

A bank 144 is formed on the passivation layer 140 and covers edges of the first electrode 110. Namely, the bank 144 includes an opening exposing a center of the first electrode 110.

An emitting layer 120, which contacts the first electrode 110 through the opening in the bank 144, is formed on the bank 144. The second electrode 130 is formed on the emitting layer 120.

The first electrode 110, the emitting layer 120 and the second electrode 130 constitute the organic light emitting diode "D". When the voltages are applied to the first and second electrodes 110 and 130, the light is emitted from the emitting layer 120, and the images are displayed through the first electrode 110 or the second electrode 130. The first electrode 110 may be the anode, and the second electrode 130 may be the cathode.

The sealing layer 150 is formed on the second electrode 130, and the first and second substrate 101 and 160 are attached by the sealing layer 150. Due to the sealing layer 150, infiltration of moisture or particles from an outer space is prevented and an outer impact is absorbed.

Referring to FIG. 4, the emitting layer 120 includes the EML 123 and the HTL 122 between the EML 123 and the first electrode 110. The host material in the EML 123 has the first triplet energy, and the material in the HTL 122 has the second triplet energy being larger than the first triplet energy.

Alternatively, as shown in FIG. 6, the emitting layer 120 includes the EML1 223a, the HTL 222 between the EML1 223a and the first electrode 210, and the EML2 223b between the EML1 223a and the second electrode 230. The first host material in the EML1 223a has the first triplet energy, and the material in the HTL 222 has the second triplet energy being larger than the first triplet energy. In addition, the second host material in the EML2 223b has the third triplet energy being larger than the first triplet energy.

In the OLED display device 100, the energy transition of the exciton from the EML 123 as an emission region into the HTL 122 or the energy transition of the exciton from the EML1 223a as an emission region into the HTL 222 and the EML2 223b is prevented or reduced. As a result, the emission efficiency of the organic light emitting diode "D" is improved, and the power consumption of the OLED display device 100 is reduced.

On the other hand, the organic light emitting diode "D" may include a carrier generation layer between the anode and the cathode, and the hole transporting layer and the first and/or the second emitting material layers are formed between the anode and the charge generation layer and between the charge generation layer and the cathode. The relation of the triplet energy between the host material in the first emitting material layer and the material in the hole transporting layer (and the second host material in the second emitting material layer) is also adapted into the OLED display device having the above structure. The properties of the organic light emitting diode will be explained.

Comparative Example 1

The first electrode is formed on the glass substrate by depositing indium-tin-oxide (ITO), and the hole injecting layer (50 Å) is formed on the first electrode by using the material (HAT-CN) of the following Formula 4.

Next, the hole transporting layer (400 Å) is formed on the hole injecting layer by using the material (HTL1) of the Formula 2. The first emitting material layer (150 Å) is formed on the hole transporting layer by using the host material (HOST1) of the Formula 2 and the dopant material (Dopant1) of the following Formula 5, and the second emitting material layer (150 Å) is formed on the first emitting material layer by using the HOST1 and the dopant material (Dopant2) of the following Formula 6.

Next, the electron transporting layer (250 Å) is formed on the second emitting material layer by using the material of the following Formula 7, and the electron injecting layer (10 Å) and the second electrode are sequentially formed on the electron transporting layer by respectively using LiF and Al.

Comparative Example 2

There is only a difference in the hole transporting layer from Comparative Example 1. The hole transporting layer is formed using the material (HTL2) of the following Formula 8.

Example 1

There is only a difference in the first emitting material layer from Comparative Example 1. The first emitting material layer is formed using the host material (HOST2) of the Formula 1.

The triplet energy (T) of the material in the hole transporting layer and the host materials in the first and second emitting material layers and the external quantum efficiency (EQE) of the organic light emitting diode are listed in Table 1.

TABLE 1

|  |  | HTL | EML1 | EML2 | EQE (%) | Change |
|---|---|---|---|---|---|---|
| Com. Ex.1 | material T | HTL1 2.82 | HOST1 2.82 | HOST1 2.82 | 17.9 | — |
| Com. Ex.2 | material T | HTL2 2.60 | HOST1 2.82 | HOST1 2.82 | 16.1 | −10.1% |
| Ex.1 | material T | HTL1 2.82 | HOST2 2.66 | HOST1 2.82 | 21.8 | +21.8% |

As shown in Table 1, in comparison to the Comparative Example 1, where the material of the hole transporting layer and the host materials in the first and second emitting material layers have the same triplet energy, the emission efficiency in the Comparative Example 2, where the triplet energy of the material in the hole transporting layer is smaller than the triplet energy of the host material in the first emitting material layer, is decreased. However, the emission efficiency in the Example 1, where the triplet energy of the material in the hole transporting layer is larger than the triplet energy of the host material in the first emitting material layer, is increased.

Comparative Example 3

The first electrode is formed on the glass substrate by depositing ITO, and the hole injecting layer (50 Å) is formed on the first electrode by using HAT-CN.

Next, the hole transporting layer (400 Å) is formed on the hole injecting layer by using the material (HTL3) of the Formula 1. The first emitting material layer (150 Å) is formed on the hole transporting layer by using the HOST2 and the Dopant1, and the second emitting material layer (150 Å) is formed on the first emitting material layer by using the HOST2 and the Dopant1.

Next, the electron transporting layer (250 Å) is formed on the second emitting material layer by using the material of the following Formula 7, and the electron injecting layer (10 Å) and the second electrode are sequentially formed on the electron transporting layer by respectively using LiF and Al.

Example 2

There is only a difference in the second emitting material layer from Comparative Example 3. A doping ratio of the Dopant 1 in the second emitting material layer is changed to 12%.

Example 3

There is only a difference in the second emitting material layer from Example 2. A doping ratio of the Dopant 1 in the second emitting material layer is changed to 20%.

Example 4

There is only a difference in the second emitting material layer from Example 3. A thickness of the second emitting material layer is increased to 200 Å.

The triplet energy (T) of the material in the hole transporting layer and the host materials in the first and second emitting material layers and the external quantum efficiency (EQE) of the organic light emitting diode are listed in Table 2.

TABLE 2

|  |  | HTL | EML1 | EML2 | EQE (%) | Change |
|---|---|---|---|---|---|---|
| Com. Ex.3 | material | HTL3 | HOST2/D1 | HOST2/D1 | 19.8 | — |
|  | T | 2.66 | 2.66 | 2.66 |  |  |
| Ex.2 | material | HTL3 | HOST2/D1 | HOST1/D1(12%) | 20.9 | +5.6% |
|  | T | 2.66 | 2.66 | 2.82 |  |  |
| Ex.3 | material | HTL3 | HOST2/D1 | HOST1/D1(20%) | 21.8 | +10.1% |
|  | T | 2.66 | 2.66 | 2.82 |  |  |
| Ex.4 | material | HTL3 | HOST2/D1 | HOST1/D1(20%) | 21.5 | +8.6% |
|  | T | 2.66 | 2.66 | 2.82 |  |  |

As shown in Table 2, in comparison to the Comparative Example 3, where the material in the hole transporting layer and the host materials in the first and second emitting material layers have the same triplet energy, the emission efficiency in the Examples 2 to 4, where the triplet energy of the host material in the second emitting material layer is larger than the triplet energy of the host material in the first emitting material layer, is increased. In addition, regardless of the doping ratio or the thickness of the second emitting material layer, the increase of the emitting efficiency according to the triplet energy difference is substantially maintained.

Comparative Example 4

The first electrode is formed on the glass substrate by depositing ITO, and the hole injecting layer (50 Å) is formed on the first electrode by using HAT-CN.

Next, the hole transporting layer (400 Å) is formed on the hole injecting layer by using the HTL3. The first emitting material layer (150 Å) is formed on the hole transporting layer by using the material (HOST3) of the Formula 3 and the Dopant1, and the second emitting material layer (150 Å) is formed on the first emitting material layer by using the HOST2 and the Dopant1.

Next, the electron transporting layer (250 Å) is formed on the second emitting material layer by using the material of the following Formula 7, and the electron injecting layer (10 Å) and the second electrode are sequentially formed on the electron transporting layer by respectively using LiF and Al.

Example 5

There is only a difference in the second emitting material layer from Comparative Example 4. The HOST1 is used as the host material of the second emitting material layer, and the thickness of the second emitting material layer is increased to 200 Å.

Example 6

There is only a difference in the second emitting material layer from Example 5. A doping ratio of the Dopant 1 in the second emitting material layer is changed to 12%.

The triplet energy (T) of the material in the hole transporting layer and the host materials in the first and second emitting material layers and the external quantum efficiency (EQE) of the organic light emitting diode are listed in Table 3.

TABLE 3

|  |  | HTL | EML1 | EML2 | EQE (%) | Change |
|---|---|---|---|---|---|---|
| Com. Ex.4 | material | HTL3 | HOST3/D1 | HOST2/D1(20%) | 18.7 | — |
|  | T | 2.66 | 2.8 | 2.66 |  |  |
| Ex.5 | material | HTL3 | HOST3/D1 | HOST1/D1(20%) | 18.3 | −2.1% |
|  | T | 2.66 | 2.8 | 2.82 |  |  |
| Ex.6 | material | HTL3 | HOST3/D1 | HOST1/D1(12%) | 18.7 | 0% |
|  | T | 2.66 | 2.8 | 2.82 |  |  |

As shown in Table 3, in comparison to the Comparative Example 4, where the triplet energy of the material in the hole transporting layer and the host material in the second emitting material layer is smaller than the triplet energy of the host material in the first emitting material layer, the emission efficiency in the Example 5, where the triplet energy of the host material in the second emitting material layer is larger than the triplet energy of the host material in the first emitting material layer but the difference is too small, is not increased (The decrease of the emission efficiency in the Example 5 is generated by the thickness difference). In addition, regardless of the doping ratio of the second emitting material layer, the emitting efficiency is scarcely changed.

Comparative Example 5

The first electrode is formed on the glass substrate by depositing ITO, and the hole injecting layer (50 Å) is formed on the first electrode by using HAT-CN.

Next, the hole transporting layer (400 Å) is formed on the hole injecting layer by using the HTL2. The emitting material layer (300 Å) is formed on the hole transporting layer by using the HOST2 and the Dopant1.

Next, the electron transporting layer (250 Å) is formed on the emitting material layer by using the material of the following Formula 7, and the electron injecting layer (10 Å) and the second electrode are sequentially formed on the electron transporting layer by respectively using LiF and Al. The external quantum efficiency is measured as 23.3%

Example 7

There is only a difference in the hole transporting layer from Comparative Example 5. The HTL1 is used for the hole transporting layer.

In the Comparative Example 5, the triplet energy (2.60 eV) of the material in the hole transporting layer is smaller than the triplet energy (2.66 eV) of the host material in the emitting material layer. In the Example 7, the triplet energy (2.82 eV) of the material in the hole transporting layer is larger than the triplet energy (2.66 eV) of the host material in the emitting material layer. The external quantum efficiency is improved by about 10.7%.

Namely, the triplet energy of the material in the hole transporting layer is larger than the triplet energy of the host material in the emitting material layer such that the energy transition of the exciton from the emitting material layer into the hole transporting layer is prevented or reduced and the emission efficiency is improved.

[Formula 4]

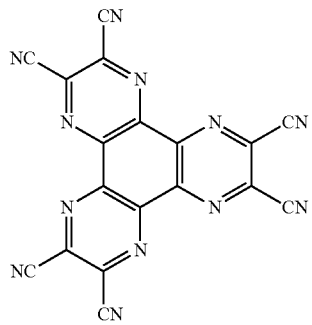

[Formula 5]

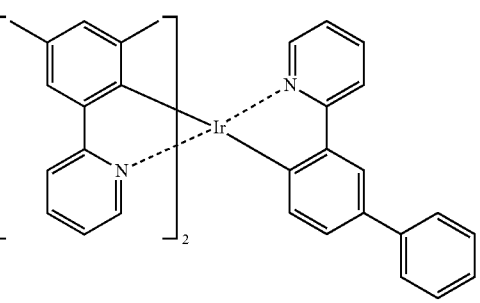

[Formula 6]

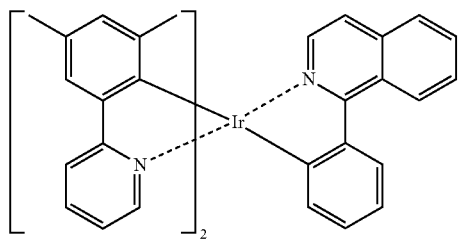

[Formula 7]

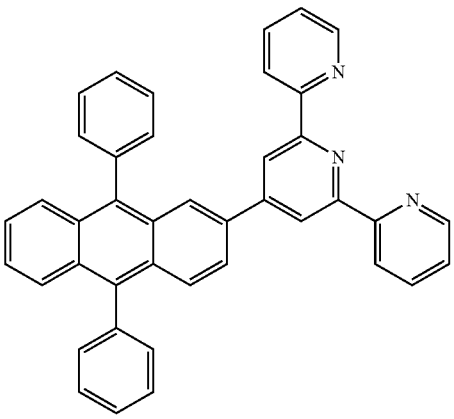

[Formula 8]

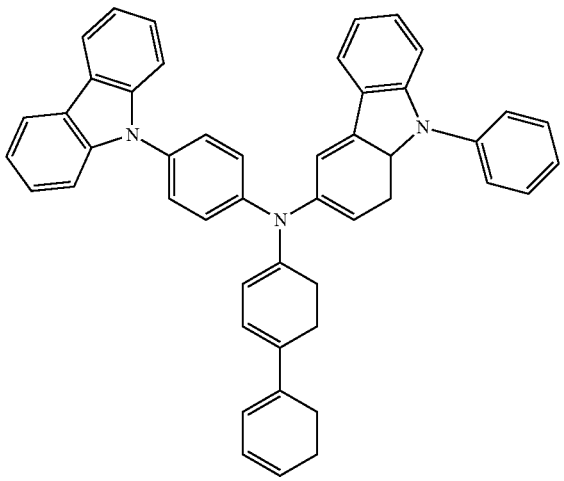

It will be apparent to those skilled in the art that various modifications and variations can be made in the embodiments of the invention without departing from the spirit or scope of the invention. Thus, it is intended that the embodiments of the invention cover the modifications and variations of this invention provided they come within the scope of the appended claims and their equivalents.

What is claimed is:

1. An organic light emitting diode, comprising:
   a first electrode;
   a second electrode facing the first electrode;
   an emitting material layer between the first electrode and the second electrode; and
   a hole transporting layer between the emitting material layer and the first electrode,
   wherein a triplet energy of the emitting material layer is less than a triplet energy of the hole transporting layer by at least 0.1 eV, and
   wherein the emitting material layer includes a material represented by Formula 1, and the hole transporting layer includes a material selected from Formula 2 or Formula 3,

[Formula 1]

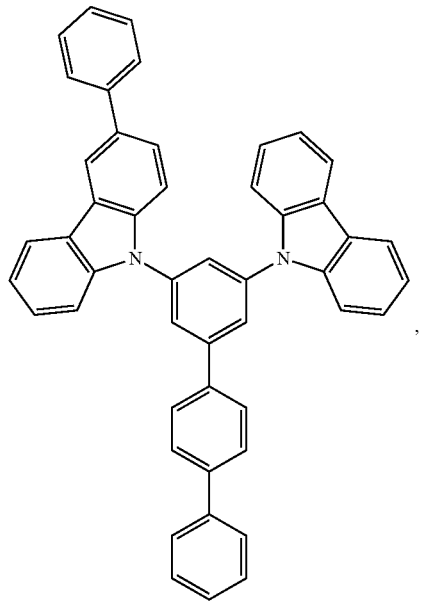

[Formula 2]

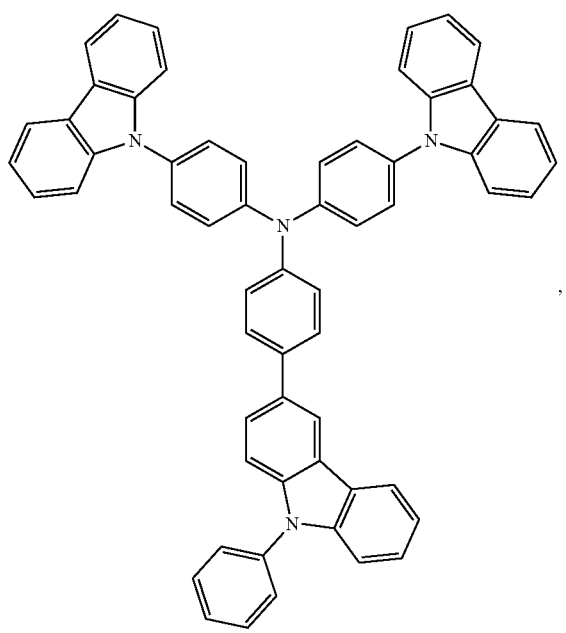

[Formula 3]

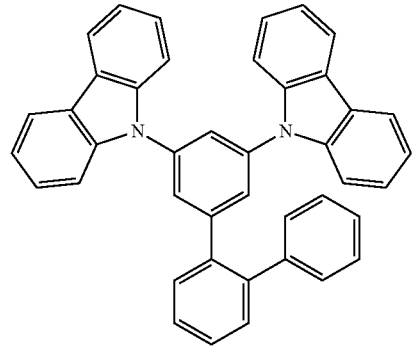

2. The organic light emitting diode according to claim 1, further comprising:

another emitting material layer between the emitting material layer and the second electrode, wherein a triplet energy of the emitting material layer is less than a triplet energy of the another emitting material, and the another emitting material layer includes a material represented by the Formula 2 or the Formula 3.

3. The organic light emitting diode according to claim 2, wherein the triplet energy of the another emitting material layer is larger than that of the emitting material layer by at least 0.1 eV.

4. An organic light emitting diode display device, comprising:

a gate line and a data line on a first substrate and crossing each other;

a power line parallel to one of the gate line and the data line;

a switching thin film transistor connected to the gate line and the data line;

a driving thin film transistor connected to the switching thin film transistor and the power line; and the organic light emitting diode of claim 1, the organic light emitting diode being connected to the driving thin film transistor.

* * * * *